United States Patent
Kuo et al.

(10) Patent No.: US 6,498,757 B2
(45) Date of Patent: Dec. 24, 2002

(54) STRUCTURE TO INSPECT HIGH/LOW OF MEMORY CELL THRESHOLD VOLTAGE USING CURRENT MODE SENSE AMPLIFIER

(75) Inventors: Jew-Yong Kuo, Hsinchu (TW); Albert Sun, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/833,172

(22) Filed: Apr. 11, 2001

(65) Prior Publication Data

US 2002/0060939 A1 May 23, 2002

(30) Foreign Application Priority Data

Nov. 23, 2000 (TW) .......................... 89124861 A

(51) Int. Cl.⁷ .......................... G11C 7/02; G11C 16/04; G11C 16/06; G11C 7/00
(52) U.S. Cl. ............... 365/207; 365/185.13; 365/185.2; 365/185.24; 365/189.09; 365/189.11
(58) Field of Search ................. 365/189.09, 189.11, 365/207, 210, 185.13, 185.2, 185.21, 185.24

(56) References Cited

U.S. PATENT DOCUMENTS

| | | | | |
|---|---|---|---|---|
| 4,636,664 A | * | 1/1987 | Craycraft et al. | 327/52 |
| 5,175,451 A | * | 12/1992 | Ihara | 327/538 |
| 5,422,842 A | * | 6/1995 | Cernea et al. | 365/185.14 |
| 5,508,958 A | * | 4/1996 | Fazio et al. | 365/168 |
| 5,675,535 A | * | 10/1997 | Jinbo | 365/185.2 |
| 5,687,114 A | * | 11/1997 | Khan | 365/185.03 |
| 5,687,352 A | * | 11/1997 | Beat | 711/100 |
| 5,867,427 A | * | 2/1999 | Sato | 365/185.2 |
| 5,898,617 A | * | 4/1999 | Bushey et al. | 365/185.2 |
| 6,201,742 B1 | * | 3/2001 | Hirai et al. | 365/185.2 |
| 6,249,457 B1 | * | 6/2001 | Okamoto | 365/185.09 |
| 6,323,693 B1 | * | 11/2001 | Park | 327/52 |
| 6,351,416 B2 | * | 2/2002 | Fuchigami et al. | 365/185.21 |

* cited by examiner

Primary Examiner—David Nelms
Assistant Examiner—Ly Duy Pham
(74) Attorney, Agent, or Firm—J. C. Patents

(57) ABSTRACT

A structure to inspect high/low of memory cell threshold voltage using a current mode sense amplifier. A current mode sense amplifier is used to compare a memory cell current of a selected memory cell and a reference current to determine high/low of the threshold voltage. Since the current input is compared, it is not necessary to provide a reference word line and a reference memory cell circuit. The area is thus decreased, and the waiting time to convert current to voltage is saved to greatly increase the access speed.

5 Claims, 3 Drawing Sheets

STRUCTURE TO INSPECT HIGH/LOW OF MEMORY CELL THRESHOLD VOLTAGE USING CURRENT MODE SENSE AMPLIFIER

CROSS-REFERENCE TO RELATED APPLICATION

This application claims the priority benefit of Taiwan application serial no. 89124861, filed Nov. 23, 2000.

BACKGROUND OF THE INVENTION

1. Field of the Invention

The invention relates in general to a structure to inspect high/low of a memory cell threshold voltage. More particularly, the invention relates to a structure to inspect high/low of a memory cell threshold voltage using a current mode sense amplifier.

2. Description of the Related Art

The conventional flash memory is basically designed in a voltage mode. Therefore, to separate a high threshold voltage memory cell from a low threshold voltage memory cell, the current of the selected memory cell has to be converted to voltage. A reference voltage generated by a reference memory cell is compared to the voltage of a selected memory cell. If the output result is "0", the selected memory cell has a high threshold voltage. On the contrary, if the output result is "1", the selected memory cell has a low threshold voltage.

FIG. 1 shows a conventional structure to compare a reference memory cell near the bit line voltage with a selected memory cell. The structure comprises a bit line decoder 10, a word line decoder 12, a memory cell 14, a current-to-voltage converter 16, a reference word line 18, a reference memory cell 20, a reference voltage 22 and a voltage sense amplifier 24.

An output of the bit line decoder 10 is coupled to a drain of the memory cell 14. An output of the word line decoder 12 is coupled to a gate of the memory cell 14. A source of the memory cell 14 is coupled to a ground voltage Vss. The output of the bit line decoder 10 is further coupled to the current-to-voltage converter 16. A gate of the reference memory cell 20 at the other side is coupled to the reference word line 18. A drain of the reference memory cell 20 is coupled to another bit line decoder (not shown), and a source thereof is coupled to the ground voltage Vss. A drain of the reference memory cell 20 is coupled to the reference voltage 22. That is, both the drain of the reference memory cell 22 and the current-to-voltage converter 16 are coupled to the voltage sense amplifier 24.

The above structure is used to detect the Vt distribution of memory cells on a chip, so as to trace the problems in fabrication process and to maintain a correct access. However, the structure is restricted with the variation range of VDD. When the variation of VDD exceeds ±10%, the word line voltage dependent on the VDD has a significant variation. Thus, the reference voltage bias node applied to the voltage sense amplifier 24 is shifted to cause an error access. Therefore, the conventional structure is not suitable for use in a flash memory with a voltage source having a wide variation range. In addition, using the comparison of voltage, the current of the selected memory cell has to be converted into voltage (the current-to-voltage converter 16 is required), so that the reading speed is slowed down. The addition of reference word line 18 and the reference memory cell 20 increases the occupied area.

SUMMARY OF THE INVENTION

The invention provides a structure to inspect high/low of memory cell threshold voltage using a current mode sense amplifier. A current is input for comparison. When the high threshold voltage is selected, there is no current generated. When the low threshold voltage is selected, a current is generated. Therefore, one does not need to consider the situation of exceeding amplitude. In addition, the current-to-voltage conversion is not required, so that the reference word line and the reference memory cell are not required either. The consumed area is reduced.

The invention provides a structure to inspect high/low of memory cell threshold voltage using current mode sense amplifier. The structure comprises a selected memory cell, a reference current generator and a current sense amplifier.

A gate of the selected memory cell receives a stabilized voltage. A source of the selected memory cell is coupled to a ground voltage, and a drain of the selected memory cell is coupled to a reference current. The current sense amplifier receives the memory cell current of the selected memory cell and the reference current to perform the operation, and to output a sense amplified signal.

The structure may further include a word line decoder to generate a word line voltage and a stabilized voltage generator to generate a fixed voltage. The fixed voltage is a voltage with a small variation output from the word line after voltage stabilization. The structure may further comprise a potential shifter to output a potential signal after receiving the word line voltage and the fixed voltage. In addition, the memory cell current is generated by a bit line decoder. The bit line decoder is coupled to a drain of the selected memory cell.

The current sense amplifier comprises a plurality of PMOS transistors, a plurality of NMOS transistors, a plurality of control valves and a plurality of inverters. A first PMOS transistor has a source connected to a high voltage and a gate connected to an activation signal. A second PMOS transistor has a source coupled to a drain of the first PMOS transistor. A drain of a first NMOS transistor is coupled to a gate and a drain of the second PMOS transistor. A gate of the first NMOS transistor is coupled to a frequency band interstitial voltage to generate a reference current. A third PMOS transistor has a source coupled to the drain of the first PMOS transistor, and a gate coupled to the gate of the second PMOS transistor. A first control valve comprises a first input/output terminal, a second input/output terminal and a first control operation terminal. The first input terminal is coupled to the drain of the third PMOS transistor. The first control operation terminal receives an erase inspection signal to control the generation of an erase inspection current. A fourth has a source coupled to the drain of the first PMOS transistor, a gate coupled to the gate of the second PMOS transistor. The first inverter receives the erase inspection signal and outputs an inverse erase inspection signal. A second control valve comprises a third input/output terminal, a fourth input/output terminal and a second control operation terminal. The third input/output terminal is coupled to a drain of the fourth PMOS transistor. The second control operation terminal receives the inverse erase inspection signal to control the generation of a reading and programming confirming current. A drain of a second NMOS transistor is coupled to the second input/output terminal of the first control valve and the fourth input/output terminal of the second control valve. A source of the second NMOS transistor is to receive a memory cell current. A second inverter has an input terminal coupled to the source of the second NMOS transistor, and an output coupled to the gate of the second NMOS transistor.

A fifth PMOS transistor has a source coupled to a high voltage, a gate and a drain coupled to the second input/output terminal of the first control valve and the fourth input/output terminal of the second control valve. A sixth PMOS transistor comprises a source coupled to the high voltage and a gate coupled to the gate of the fifth PMOS transistor. A third NMOS transistor comprises a drain and a gate coupled to the drain of the fifth PMOS transistor. A drain of a fourth NMOS transistor is coupled to a drain of the sixth PMOS transistor, and a gate of the fourth NMOS transistor is coupled to the gate of the third NMOS transistor. A third inverter receives the activation signal and outputs an inverse activation signal. A fifth NMOS transistor comprises a drain coupled to a source of the third NMOS transistor and a source of the fourth NMOS transistor, and a gate to receive the inverse activation signal. A seventh PMOS transistor comprises a source coupled to the high voltage and a gate to receive the activation voltage. An eighth PMOS transistor comprises a source coupled to a drain of the seventh PMOS transistor and a gate coupled to the drain of the sixth NMOS transistor. A sixth NMOS transistor comprises a drain and a gate coupled to the drain of the eighth PMOS transistor, and a source coupled to the ground voltage. A ninth PMOS transistor has a source coupled to the drain of the seventh PMOS transistor, and a gate coupled to the drain of the sixth PMOS transistor. A seventh NMOS transistor comprises a drain coupled to a drain of the ninth transistor, a gate coupled to the gate of the sixth NMOS transistor and a source coupled to the ground voltage. A fourth inverter comprises an input terminal coupled to the drain of the ninth PMOS transistor and an output terminal to output a sense amplified signal.

Both the foregoing general description and the following detailed description are exemplary and explanatory only and are not restrictive of the invention, as claimed.

DESCRIPTION OF THE PREFERRED EMBODIMENTS

Figure 1:
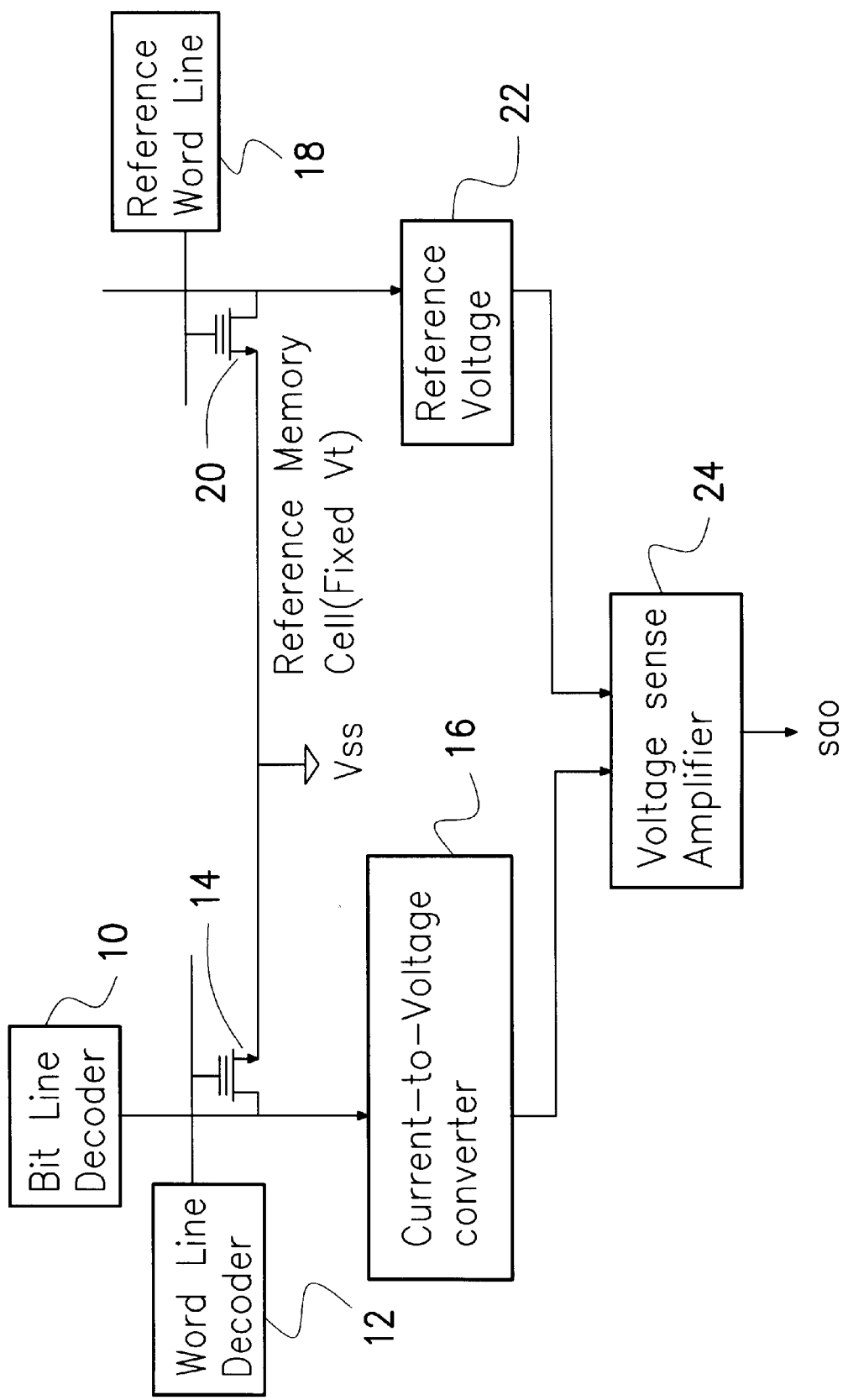
FIG. 1 shows a conventional structure to compare a reference memory cell near a bit line voltage with a selected memory cell.
Figure 2:
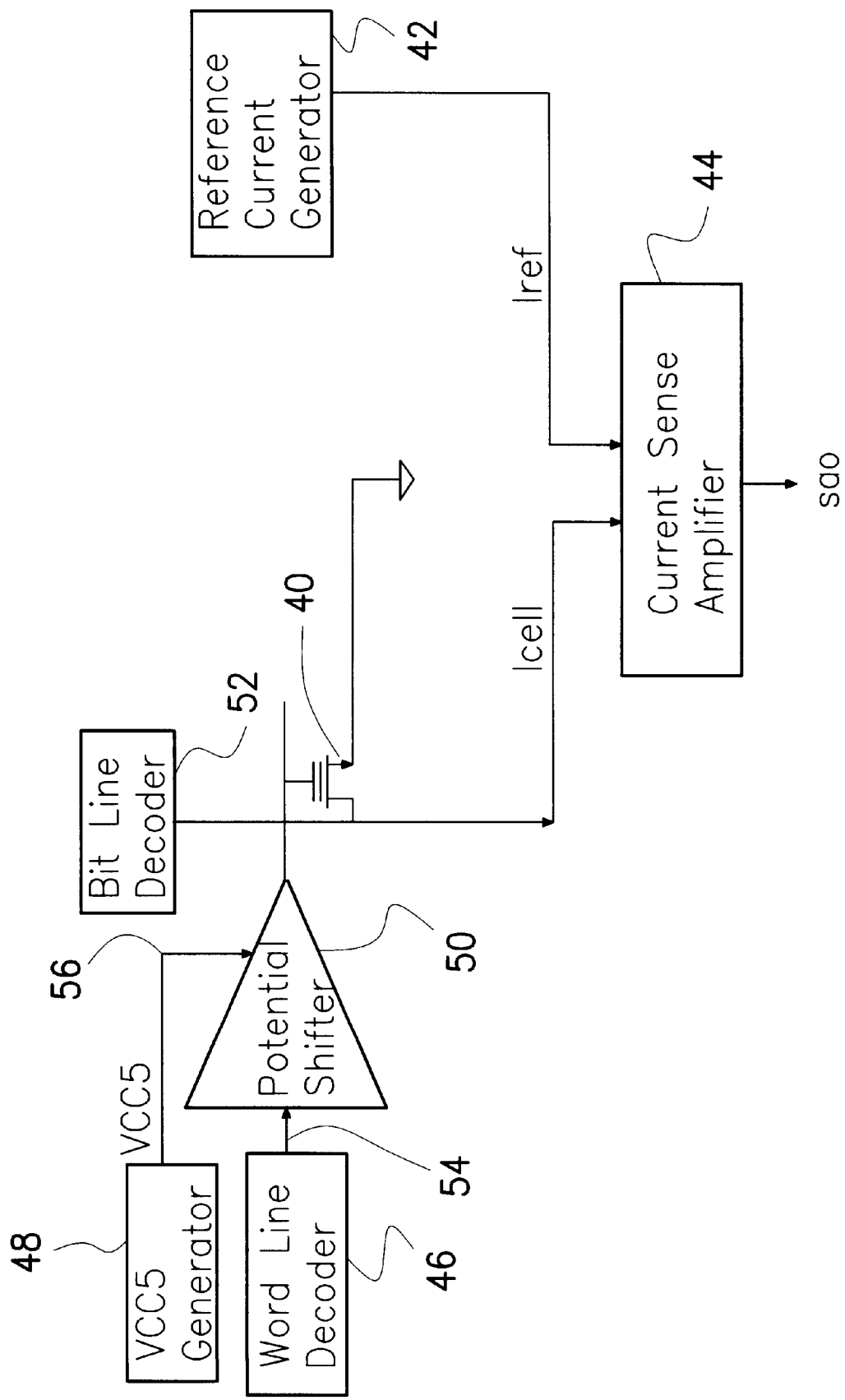
FIG. 2 shows an embodiment of a structure to inspect high/low memory cell threshold voltage using a current mode sense amplifier.

FIG. 2 shows an embodiment of a structure to inspect high/low memory cell threshold voltage using a current mode sense amplifier.

As shown in FIG. 2, the structure comprises a selected memory cell 40, a reference current generator 42 and a current sense amplifier 44. To provide the bit line voltage to the selected memory cell 40, a word line decoder 46, a stabilized voltage generator 48 (VCC5 generator) and a bit line decoder 52 are included. A memory cell current Icell of the selected memory cell 40 is generated by the bit line decoder 52.

Regarding the stabilized voltage (word line voltage) received by the gate of the selected memory cell 40, a word line voltage 54 is generated by the word line decoder 46, and the stabilized voltage generator 48 performs a voltage stabilization according to the word line voltage variation. A fixed voltage 56 (VCC5) is output. According to the received word line voltage 54 and the fixed voltage 56, the potential shifter 50 outputs a potential signal. For example, when the word line voltage 54 is a high voltage (between 2.7V to 5.5V), the potential signal is output according to the fixed voltage 56 (such as 4.75V), so that the bit line voltage is not varied too much.

In addition, a memory cell current Icell output from a drain of the selected memory cell 40 is generated by the bit line decoder 52. The source of the selected memory cell 40 is coupled to a ground voltage. The reference current generator 42 generates a reference current Iref. The internal structure of the reference current generator 42 is introduced later. The current sense amplifier 44 receives both the memory cell current Icell of the selected memory cell 40 and the reference current Iref of the reference current generator. After comparison, a sense amplified signal sao is output.

Figure 3:
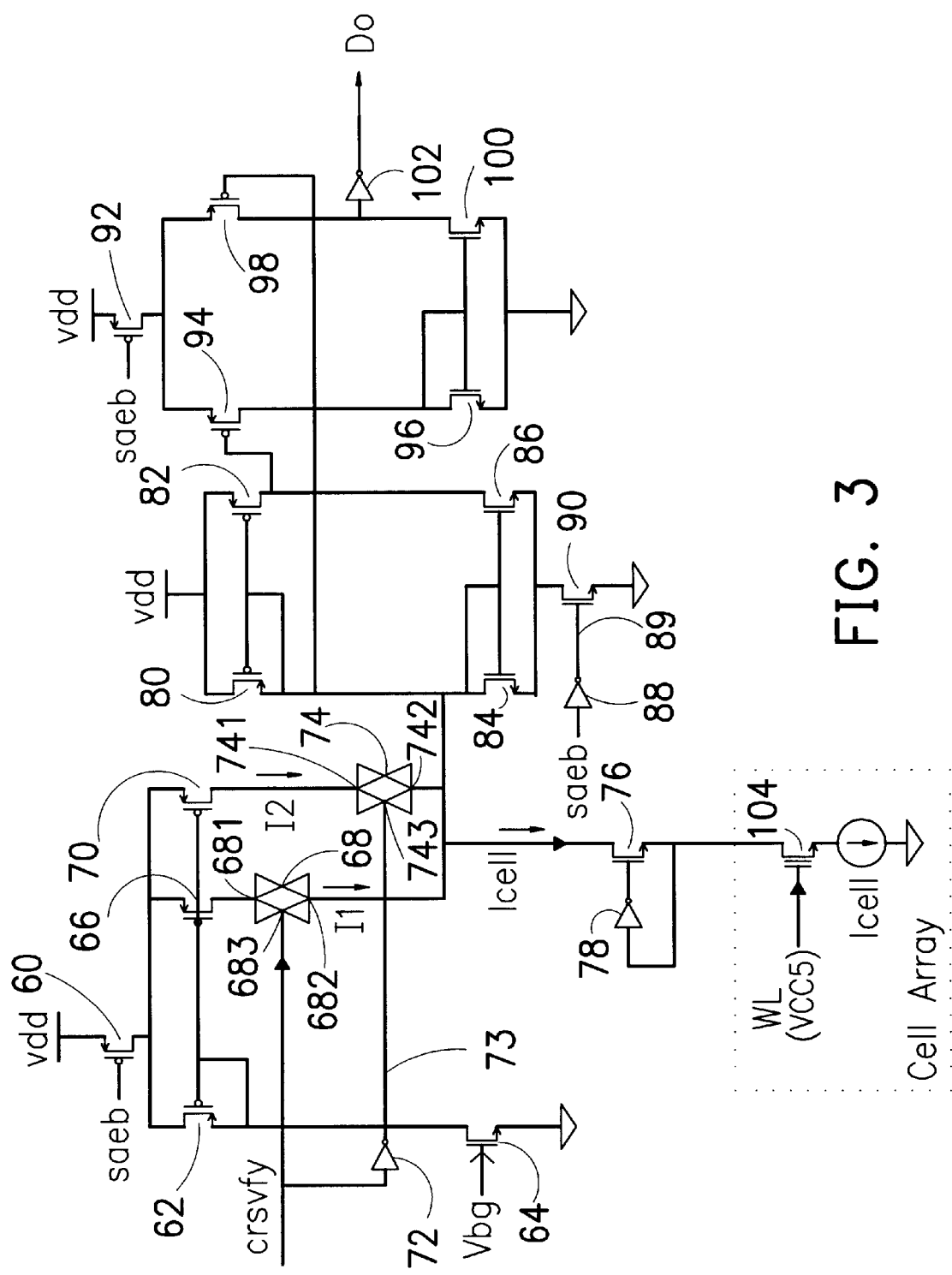
FIG. 3 shows a circuit diagram of the selected memory cell, the reference current generator and the current sense amplifier.

Please refer to FIG. 3 for a further detailed illustration of the current sense amplifier. In FIG. 3, the selected memory cell 40, the reference current generator 42 and the current sense amplifier 44 are illustrated. The current sense amplifier 44 comprises a first to ninth PMOS transistors 60, 62, 64, 66, 70, 80, 82, 92, 94, 98, a first to seventh NMOS transistors 64, 76, 84, 86, 90, 96, 100, a first to second control valves 68, 74, and a first to fourth inverters 72, 78, 88, 102.

The first PMOS transistor 60 comprises a source coupled to a high voltage Vdd and a gate coupled to an activation signal to control the operation of the sense amplifier. The second PMOS transistor comprises a source coupled to a drain of the first PMOS transistor 60, a gate and a drain coupled to a drain of the first NMOS transistor 64. A gate of the first NMOS transistor 64 is coupled to a frequency band interstitial voltage Vbg. The structure is to generate a reference current Iref.

The third PMOS transistor 66 comprises a source coupled to the drain of the first PMOS transistor 60 and a gate coupled to the gate of the second PMOS transistor 62. The first control valve 68 comprises a first input/output terminal 681, a second input/output terminal 682, and a control operation terminal 683. The first input/output terminal 681 is coupled to a drain of the third PMOS transistor 66. The first control operation terminal 683 is to receive an erase inspection signal ersvfy to control the generation of an erase inspection current I1. The fourth PMOS transistor 70 comprises a source coupled to the drain of the first PMOS transistor 60 and a gate coupled to the gate of the second PMOS transistor 62. The first inverter 72 receives the erase inspection signal ersvfy to output an inverse erase inspection signal 73 as a normal reading signal. The second control valve 74 comprises a third input/output terminal 741, a fourth input/output terminal 742 and a second control operation terminal 743. The third input/output terminal 741 is coupled to a drain of the fourth PMOS transistor 70. The second control operation terminal receives the inverse erase inspection signal 73 to control the generation of a reading and programming confirming current I2. The second NMOS transistor 76 comprises a drain coupled to the second input/output terminal 682 of the first control valve 68 and the fourth input/output terminal 742 of the second control valve 74, and a source to receive the memory cell current Icell. The source is coupled to a drain of the selected memory cell 104. The memory cell 104 is conducted via the word line voltage VCC5 applied to a gate thereof. The source of the memory cell 104 is coupled to the memory cell current Icell. An input terminal of the second inverter 78 is coupled to the source of the second NMOS transistor 76. An output terminal of the second inverter 78 is coupled to the gate of the second NMOS transistor 76.

The fifth PMOS transistor 80 comprises a source coupled to a high voltage Vdd, a gate and a drain coupled to the second input/output terminal 682 of the first control valve 68 and the fourth input/output terminal 742 of the second control valve 74. The sixth PMOS transistor 82 comprises a source coupled to the high voltage Vdd and a gate coupled to the gate of the fifth PMOS transistor 80. A drain and a gate of the third NMOS transistor 84 are coupled to the drain of the fifth PMOS transistor 80. The fourth NMOS transistor 86 comprises a drain coupled to a drain of the sixth PMOS transistor 82 and a gate coupled to the gate of the third NMOS transistor 84. The third inverter 88 receives the activation signal saeb and outputs an inverse activation signal 89. The fifth NMOS transistor 90 comprises a drain coupled to the source of the third NMOS transistor 84 and a source of the fourth NMOS transistor 86, and a gate to receive the inverse activation signal 89. A comparison is performed among the current I1 output from the second input/output terminal 682 of the first control valve 68, the current I2 output from the fourth input/output terminal 742 of the second control valve 74 and the memory cell current Icell.

The seventh PMOS transistor 92 comprises a source coupled to the high voltage Vdd and a gate to receive the activation signal saeb. The eighth PMOS transistor 94 comprises a source coupled to a drain of the seventh PMOS transistor 92 and a gate coupled to the drain of the sixth PMOS transistor 82. The sixth NMOS transistor 96 comprises a drain and a gate coupled to a drain of the eighth PMOS transistor 94, and a source coupled to the ground voltage. The ninth PMOS transistor 98 comprises a source coupled to the drain of the seventh PMOS transistor and a gate coupled to the drain of the sixth PMOS transistor 80. The seventh NMOS transistor 100 comprises a drain coupled to a drain of the ninth PMOS transistor 98, a gate coupled to the gate of the sixth NMOS transistor 96, and a source coupled to the ground voltage. The fourth inverter 102 comprises an input terminal coupled to the drain of the ninth PMOS transistor 98 and an output terminal to output a sense amplified signal Dout.

According to the above, this structure to inspect the high/low threshold voltage of a selected memory cell using a current mode sense amplifier uses a current input for comparison. Therefore, the situation of exceeding amplitude does not need to be considered. The conversion from current to voltage is saved, and only a reference current is required. The area is thus greatly reduced.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A structure to inspect high/low voltage memory cell threshold voltage using a current mode sense amplifier, the structure comprising:
   a word line decoder which generates a word line voltage;
   a potential shifter which receives the word line voltage and a fixed voltage, and then outputs a stabilized voltage according to the word line voltage and the fixed voltage, wherein the fixed voltage is a voltage with limited variation after the word line voltage is stabilized;
   a selected memory cell, comprising a gate to receive the stabilized voltage output from the potential shifter, a source coupled to a ground voltage and a drain to output a memory cell current;
   a reference current generator, to generate a reference current; and
   a current sense amplifier, to receive a memory cell current of the selected memory cell and the reference current, and then to output a sense amplified signal after the comparison of the memory cell current with the reference current.

2. The structure according to claim 1, comprising further: a voltage stabilized generator for generating the fixed voltage.

3. The structure according to claim 1, wherein the memory cell current is generated by a bit line decoder which is coupled to the drain of the selected memory cell.

4. The structure according to claim 1, wherein the current sense amplifier comprises:
   a first PMOS transistor, comprising a source coupled to a high voltage, a gate coupled to an activation signal and a drain;
   a second PMOS transistor, comprising a source coupled to a the drain of the first PMOS transistor, a gate and a drain;
   a first NMOS transistor, comprising a drain coupled to the gate and the drain of the second PMOS transistor, a gate coupled to a frequency band interstitial voltage to generate a reference current, and a source;
   a third PMOS transistor, comprising a source coupled to the drain of the first PMOS transistor, a gate coupled to the gate of the second PMOS transistor and a drain;
   a first control valve, comprising a first input/output terminal, a second input/output terminal and a first control operation terminal, wherein the first input/output terminal is coupled to the drain of the third PMOS transistor and the first control operation terminal receives an erase inspection signal to control the generation of an erase inspection current;
   a fourth PMOS transistor, comprising a source coupled to the drain of the first PMOS transistor, a gate coupled to the gate of the second PMOS transistor, and a drain;
   a first inverter, to receive the erase inspection signal and to output an inverse erase inspection signal;
   a second control valve, comprising a third input/output terminal, a fourth input/output terminal and a second control operation terminal, wherein the third input/output terminal is coupled to the drain of the fourth PMOS transistor and the second control operation terminal receives the inverse erase inspection signal to control the generation of a reading and programming confirming current;
   a second NMOS transistor, comprising a drain coupled to the second input/output terminal of the first control valve and the fourth input/output terminal of the second control valve, a source to receive the memory cell current and a gate;
   a second inverter, with an input terminal coupled to the source of the second NMOS transistor and an output terminal coupled to the gate of the second NMOS transistor;
   a fifth PMOS transistor, comprising a source coupled to the high voltage, a gate and a drain coupled to the second input/output terminal of the first control valve and the fourth input/output terminal of the second control valve;

a sixth PMOS transistor, comprising a source coupled to the high voltage, a gate coupled to the gate of the fifth PMOS transistor and a drain;

a third NMOS transistor, comprising a drain and a gate coupled to the drain of the fifth PMOS transistor and a source;

a fourth NMOS transistor, comprising a drain coupled to the drain of the sixth PMOS transistor, a gate coupled to the gate of the third NMOS transistor and a source;

a third inverter, to receive the activation signal and output an inverse activation signal;

a fifth NMOS transistor, comprising a drain coupled to the source of the third NMOS transistor and the source of the fourth NMOS transistor, a gate to receive the inverse activation signal and a source;

a seventh PMOS transistor, comprising a source coupled to the high voltage, a gate to receive the activation signal and a drain;

an eighth PMOS transistor, comprising a source coupled to the drain of the seventh PMOS transistor, a gate coupled to the drain of the sixth PMOS transistor and a drain;

a sixth NMOS transistor, comprising a drain and a gate coupled to the drain of the eighth transistor, and a source coupled to the ground voltage;

a ninth PMOS transistor, comprising a source coupled to the drain of the seventh PMOS transistor, a gate coupled to the drain of the sixth PMOS transistor and a drain;

a seventh NMOS transistor, comprising a drain coupled to the drain of ninth PMOS transistor, a gate coupled to the gate of the sixth NMOS transistor and a source coupled to the ground voltage; and a fourth inverter, comprising an input terminal coupled to the drain of the ninth PMOS transistor, and an output terminal to output a sense amplified signal.

5. A structure to inspect high/low voltage memory cell threshold voltage using a current mode sense amplifier, the structure comprising:

a selected memory cell, comprising a gate to receive a stabilized voltage, a source coupled to a ground voltage and a drain to output a memory cell current;

a reference current generator, to generate a reference current; and a current sense amplifier, to receive a memory cell current of the selected memory cell and the reference current, and to output a sense amplified signal, wherein the current sense amplifier comprises:

a first PMOS transistor, comprising a source coupled to a high voltage, a gate coupled to an activation signal and a drain;

a second PMOS transistor, comprising a source coupled to a the drain of the first PMOS transistor, a gate and a drain;

a first NMOS transistor, comprising a drain coupled to the gate and the drain of the second PMOS transistor, a gate coupled to a frequency band interstitial voltage to generate a reference current, and a source;

a third PMOS transistor, comprising a source coupled to the drain of the first PMOS transistor, a gate coupled to the gate of the second PMOS transistor and a drain;

a first control valve, comprising a first input/output terminal, a second input/output terminal and a first control operation terminal, wherein the first input/output terminal is coupled to the drain of the third PMOS transistor and the first control operation terminal receives an erase inspection signal to control the generation of an erase inspection current;

a fourth PMOS transistor, comprising a source coupled to the drain of the first PMOS transistor, a gate coupled to the gate of the second PMOS transistor, and a drain;

a first inverter, to receive the erase inspection signal and to output an inverse erase inspection signal;

a second control valve, comprising a third input/output terminal, a fourth input/output terminal and a second control operation terminal, wherein the third input/output terminal is coupled to the drain of the fourth PMOS transistor and the second control operation terminal receives the inverse erase inspection signal to control the generation of a reading and programming confirming current;

a second NMOS transistor, comprising a drain coupled to the second input/output terminal of the first control valve and the fourth input/output terminal of the second control valve, a source to receive the memory cell current and a gate;

a second inverter, with an input terminal coupled to the source of the second NMOS transistor and an output terminal coupled to the gate of the second NMOS transistor;

a fifth PMOS transistor, comprising a source coupled to the high voltage, a gate and a drain coupled to the second input/output terminal of the first control valve and the fourth input/output terminal of the second control valve;

a sixth PMOS transistor, comprising a source coupled to the high voltage, a gate coupled to the gate of the fifth PMOS transistor and a drain;

a third NMOS transistor, comprising a drain and a gate coupled to the drain of the fifth PMOS transistor and a source;

a fourth NMOS transistor, comprising a drain coupled to the drain of the sixth PMOS transistor, a gate coupled to the gate of the third NMOS transistor and a source;

a third inverter, to receive the activation signal and output an inverse activation signal;

a fifth NMOS transistor, comprising a drain coupled to the source of the third NMOS transistor and the source of the fourth NMOS transistor, a gate to receive the inverse activation signal and a source;

a seventh PMOS transistor, comprising a source coupled to the high voltage, a gate to receive the activation signal and a drain;

an eighth PMOS transistor, comprising a source coupled to the drain of the seventh PMOS transistor, a gate coupled to the drain of the sixth PMOS transistor and a drain;

a sixth NMOS transistor, comprising a drain and a gate coupled to the drain of the eighth transistor, and a source coupled to the ground voltage;

a ninth PMOS transistor, comprising a source coupled to the drain of the seventh PMOS transistor, a gate coupled to the drain of the sixth PMOS transistor and.a drain;

a seventh NMOS transistor, comprising a drain coupled to the drain of ninth PMOS transistor, a gate coupled to the gate of the sixth NMOS transistor and a source coupled to the ground voltage; and a fourth inverter, comprising an input terminal coupled to the drain of the ninth PMOS transistor, and an output terminal to output a sense amplified signal.

* * * * *